(12) United States Patent
Kriebernegg et al.

(10) Patent No.: US 10,950,187 B2
(45) Date of Patent: Mar. 16, 2021

(54) METHOD FOR SENSING LIGHT BEING INCIDENT ON AN ELECTRONIC DEVICE

(71) Applicant: ams AG, Premstaetten (AT)

(72) Inventors: Josef Kriebernegg, Graz (AT); Bernhard Greimel-Rechling, Gleisdorf (AT); Herbert Lenhard, Graz (AT); Peter Bliem, Premstaetten (AT); Joachim Lechner, Margarethen An der Raab (AT); Christian Halper, Olbendorf (AT); Manuel Hoerbinger, Voitsberg (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/489,947

(22) PCT Filed: Feb. 7, 2018

(86) PCT No.: PCT/EP2018/053058
§ 371 (c)(1),
(2) Date: Aug. 29, 2019

(87) PCT Pub. No.: WO2018/158055
PCT Pub. Date: Sep. 7, 2018

(65) Prior Publication Data
US 2019/0392772 A1    Dec. 26, 2019

(30) Foreign Application Priority Data

Mar. 2, 2017    (EP) .................................... 17158941

(51) Int. Cl.
*G09G 3/34*    (2006.01)
*H03K 7/08*    (2006.01)

(52) U.S. Cl.
CPC ............. *G09G 3/3406* (2013.01); *H03K 7/08* (2013.01); *G09G 2310/0237* (2013.01); *G09G 2320/0626* (2013.01); *G09G 2360/144* (2013.01)

(58) Field of Classification Search
CPC .................................................... G09G 3/3406
(Continued)

(56) References Cited

U.S. PATENT DOCUMENTS

2007/0279369 A1    12/2007 Yao et al.
2008/0284716 A1    11/2008 Edwards et al.
(Continued)

FOREIGN PATENT DOCUMENTS

EP           2804047       11/2014
WO       2014/077950        5/2014

OTHER PUBLICATIONS

European Patent Office, International Search Report for PCT/EP2018/053058 dated Apr. 20, 2018.

*Primary Examiner* — Long D Pham
(74) *Attorney, Agent, or Firm* — MH2 Technology Law Group LLP

(57) ABSTRACT

A method is suggested for sensing light being incident on an electronic device. The electronic device comprises a display and a light sensor arrangement mounted behind the display such as to receive incident light through the display. The method comprises periodically switching the display on and off depending on a control signal, wherein a period is defined by a succession of an on-state and an off-state of the display. A sensor signal is generated by integrating the incident light by means of the light sensor arrangement for a total integration time comprising a number of periods. A first signal count is determined from the sensor signal being indicative of an amount of integrated incident light during an on-state. A second signal count is determined from the (Continued)

sensor signal being indicative of an amount of integrated incident light during an off-state. A third signal count is determined from the sensor signal being indicative of an amount of integrated incident light during the total integration time. Finally, an ambient light level is determined depending on the first, second and third signal counts.

17 Claims, 2 Drawing Sheets

(58) Field of Classification Search
USPC .......................................................... 345/690
See application file for complete search history.

(56) References Cited

U.S. PATENT DOCUMENTS

| | | | |
|---|---|---|---|
| 2014/0132158 A1* | 5/2014 | Land .................. | G09G 3/20 315/152 |
| 2014/0166850 A1* | 6/2014 | Zheng ................ | G09G 3/3406 250/205 |
| 2015/0069918 A1* | 3/2015 | Trattler ............... | G01J 1/0488 315/151 |

* cited by examiner

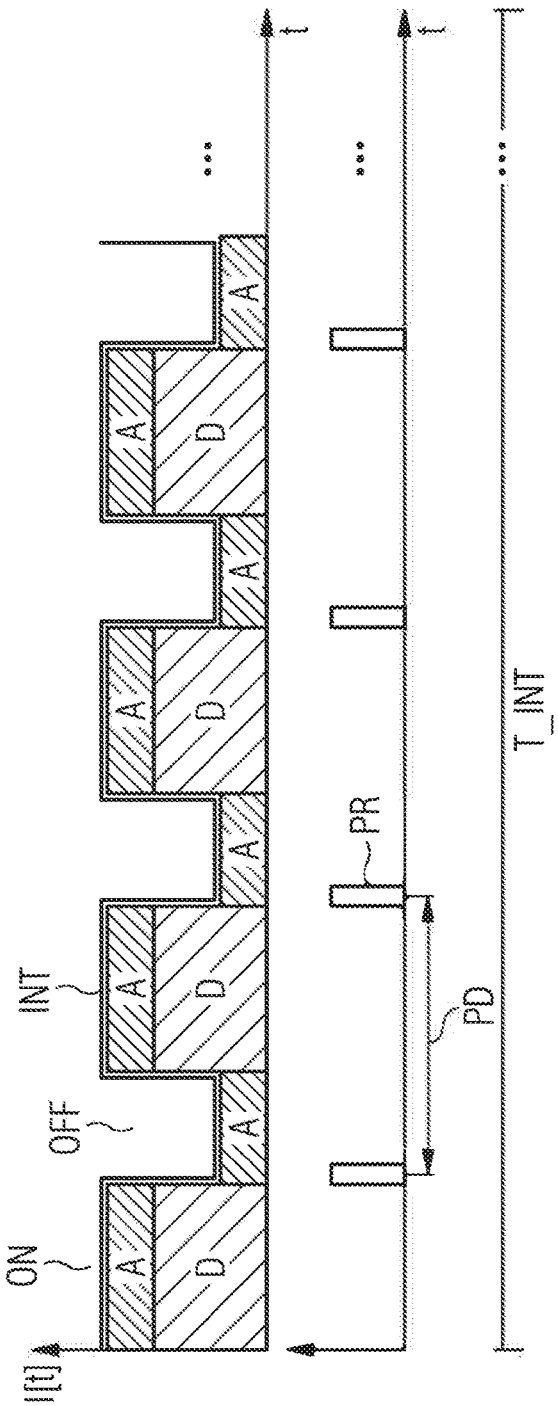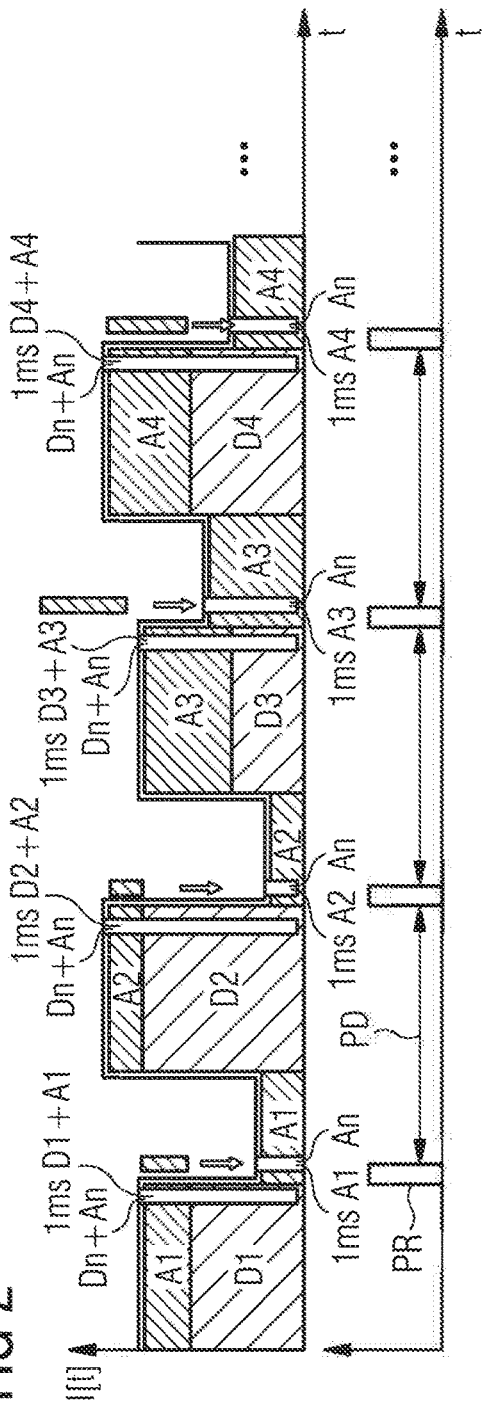

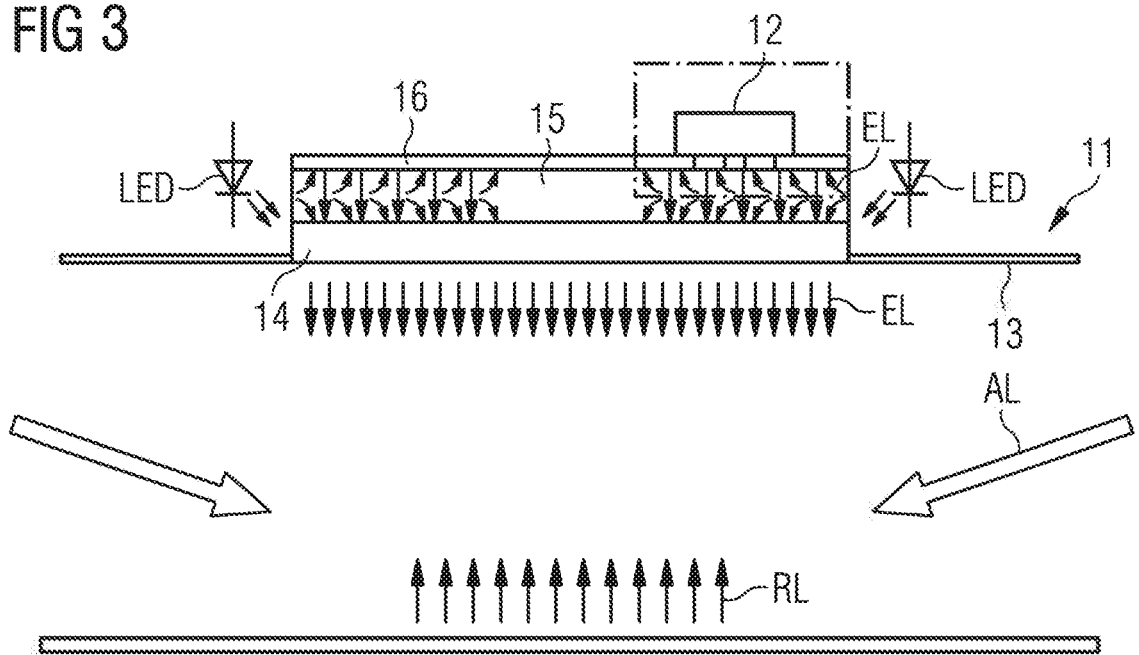
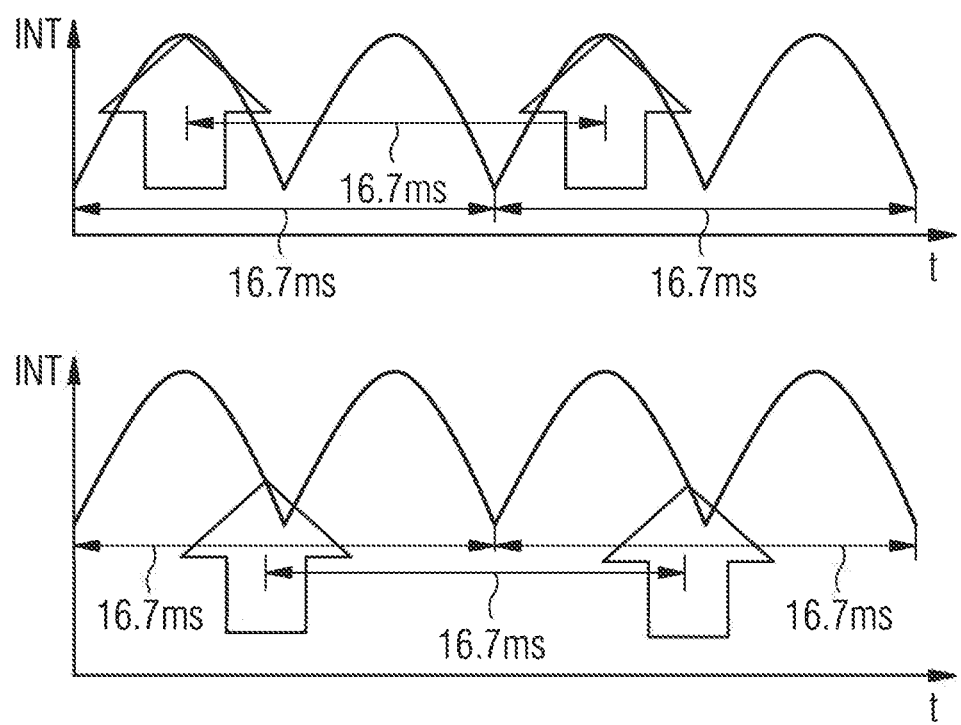

METHOD FOR SENSING LIGHT BEING INCIDENT ON AN ELECTRONIC DEVICE

The invention relates to a method for light sensing, in particular for light sensing of ambient light incident on a display.

BACKGROUND OF THE INVENTION

Light sensors such as ambient light sensors (ALS) are widely used in mobile devices such as mobile phones, smartphones, computers and tablets. ALS sensors provide information about ambient light levels which can be used to support display control such as a backlight LED power circuit. For example, the backlight of a LCD panel in a smartphone accounts for around 40% of the device's total power consumption. Thus, there is a great benefit to be gained from adjusting its brightness in response to changes in ambient light levels. In a relatively dark environment, the brightness of the display can be reduced to save power. This is also easier on the user's eyes, and so improves the user experience at the same time.

Due to design constraints, however, ALS sensors could be mounted behind a display screen in order to save space and hide the sensor and electronics away from sight. Furthermore, the ALS sensor often has additional functionality such as proximity detection as thus should be placed close to the display in order to function correctly. These and other constraints limit the freedom for the design engineer to optimize the design of the ALS sensor.

There have been attempts made in the art to integrate a light sensor into the display but not completely behind a display. WO 2014/077950 A1 shows such a display, e.g. a LCD with backlight illumination or a light-emitting display, which is controlled by an ambient light sensor. The display is repeatedly switched off under the control of the ALS sensor and then an ALS measurement is executed without any display light included. In other words the display and ambient light sensor are controlled together in a way that only during the display off time the ALS measures the ambient light. This approach may lead to inaccurate ambient light sensing.

For example, by measuring the light just at the time when the display is off, a longer off time of the display is needed, e.g. 100 ms, to cover a 50 Hz or 60 Hz modulated or PWM controlled display emission. This is not feasible very often. On the other side, just taking measurements on slowly repeating off time frames, at display picture refresh rates of e.g. 60 Hz, will lead to wrong ALS results due to too slow measure sampling rates as required by the Nyquist criterion. FIG. 4 shows this effect. The top drawing shows a signal INT of an ALS sensor which integrates every 16.7 ms for 500 µs at maxima of 60 Hz modulated light (see arrows). The resulting sensor signal INT results in a high number of counts. In the bottom drawing, however, the ALS sensor integrates every 16.7 ms for 500 µs at minima of 60 Hz modulated light (see arrows). The resulting sensor signal INT only results in a low number of counts. In other words, a 50 Hz/60 Hz modulated light measured only at the display refresh rate being also in the range of 50 Hz/60 Hz (off time) will lead to wrong ALS measurement results.

It is to be understood that any feature described hereinafter in relation to any one embodiment may be used alone, or in combination with other features described hereinafter, and may also be used in combination with one or more features of any other of the embodiments, or any combination of any other of the embodiments, unless explicitly described as an alternative. Furthermore, equivalents and modifications not described below may also be employed without departing from the scope of the method for light sensing as defined in the accompanying claims.

SUMMARY OF THE INVENTION

In at least one embodiment a method for sensing light employs an electronic device. The electronic device comprises a display and the light sensor arrangement mounted behind the display. Light which is incident on the display may penetrate through the display and can be received by the light sensor arrangement.

The term "behind" denotes that the light sensor arrangement is placed on or into a body of the electronic device and is covered by the display. In this configuration light, which is incident on the electronic device, traverses through the display and eventually reaches the light sensor arrangement. Light detected by the light sensor arrangement basically comprises contributions from at least two sources. First, ambient light from the devices environment, e.g. sun light, room lighting, light emitted by other devices etc., may strike the display and be incident on the light sensor arrangement. Second, the display emits light, e.g. by means of active pixels or by backlighting etc., which may be guided or reflected back towards the light sensor arrangement.

Different types of displays may be used with the proposed method such as a flat-panel display including liquid crystal displays (LCDs), liquid crystal displays with light-emitting diode (LED) backlighting, plasma panels, electroluminescent panels or displays based on organic light-emitting diodes (OLEDs). The light sensor arrangement can be implemented by various types of light sensors including ambient light sensors and/or color sensors. Typically, the term "arrangement" indicates an integrated circuit having various on-chip components for signal acquisition or even (pre-) processing. A light sensor arrangement may have a single or a number of light sensors which are packaged into a common integrated circuit or spread over different locations of the electronic device.

The method for sensing light being incident on the electronic device comprises the following steps.

The display is periodically switched on and off depending on a control signal. A period is defined by a succession of an on-state and an off-state of the display. For example, the control signal may be provided by a power circuit of the electronic device, such as a backlight LED power circuit. The control signal may be pulsed in the sense that it comprises consecutive high and low levels. In turn, the display is turned on or off depending on whether the control signal is at a high and low level. The control signal is independent, i.e. not controlled by the display or a display driver.

A sensor signal is generated by integrating the incident light by means of the light sensor arrangement. Integration lasts for a total integration time comprising a number of periods. For example, the light sensor arrangement comprises means to collect incident light by integrating the signal generated by the light sensor, such as integrators of various types, light-to-frequency or light-to-voltage converters.

A first signal count is determined from the sensor signal and is indicative of an amount of integrated incident light during an on-state. For example, the sensor signal collected or integrated within a certain period of time can be translated into a signal count as a measure of intensity. Similarly, a second signal count is determined from the sensor signal and is indicative of an amount of integrated incident light during an off-state. And, a third signal count is determined from the sensor signal and is indicative of an amount of integrated incident light during the total integration time. Finally, an ambient light level is determined depending on the first, second and third signal counts.

The ambient light level can be determined, and accounted for, without the need to control the display as in prior art solutions. Measurement of the various signal counts is performed over time and includes sampling on an activated display (on-state) as well as a deactivated display (off-state). This way the first signal count represents ambient light samples from the display and ambient light while the second count represents ambient light only. The third signal count represents light samples from the display and ambient light over the duration of the total integration time. The three signal counts can be combined to get a display light level only on an activated display and finally the information the ambient light level can be determined.

In at least one embodiment the sensor signal is generated by continuously integrating the incident light for the duration of the total integration time. The total integration time is set to a value that the sensor signal is integrated over a number of periods, at least two, for example. Thus, the sensor signal is integrated over several on- and off-states of the display. For example, the total integration time may be set to 100 ms. A period may have a duration of 16.7 ms. Then about six periods of consecutive on- and off-states are included in one total integration time.

In at least one embodiment the first and second signal counts are determined by tapping the sensor signal for predetermined time during integration of the incident light. The predetermined time may last for one complete on- or off-state or any fraction of a period. For example, the predetermined time is 1 ms.

The third signal count is derived from the sensor signal integrated over the total integration time. The first and second signal counts can be determined in parallel to integration of the third signal count. For example, the first signal count is determined during an on-state. Thus, the first signal count can be determined as the amount of sensor signal integrated during an on-state. Similarly, the second signal count is determined during an off-state. Thus, the second signal count can be determined as the amount of sensor signal integrated during an off-state. Tapping allows for using the same light sensor arrangement for all three measurements. Tapping can be realized by dedicated integrators that allow to derive respective signal counts from the same sensor signals, e.g. light-to-frequency or light-to-voltage converters.

In at least one embodiment the first and second signal counts are determined from the sensor signal which is integrated during at least one period. In fact, in some embodiments only one first and one second signal count are determined. For example, the number of determined signal counts can be chosen in view of the desired accuracy to which the ambient light level needs to be determined. In a case where a lighting condition, e.g. given by the amount of incident ambient light and light emitted by the display, is constant over the total integration time it may suffice to determine just a single first and second signal count or a small number thereof.

In at least one embodiment for each period of successive on and off-states a set of a first signal count and a second signal count is determined, respectively. For example, the total integration time may be set to 100 ms and a period may have a duration of 16.7 ms. Then about six periods of consecutive on- and off-states are included in one total integration time. In this exemplary case six sets of first signal count and second signal counts are determined. Changing ambient light conditions and/or changing display content (due to picture refresh) can be accounted for and the ambient light level can be determined to a higher degree of accuracy.

In at least one embodiment at least one display level is determined from at least one first count and at least one second count. The display level is indicative of an amount of integrated incident light which is emitted by the display during at least one period. Depending on the number of first and second signal counts determined during the total integration time one or more display levels can be determined. For example, during the integration time the display may show different images with a different distribution of brightness levels. Thus, the first count may have a different value depending on the time of measurement. In such a case the first count can be determined every time the content of an image changes in order to account for said changes, e.g. right before or after the display is refreshed.

An integral level is determined from the third signal count. The integral level is indicative of a combined amount of integrated incident light which is emitted by the display during the total integration time and of incident ambient light which is received during the total integration time. Typically the integral level is equal in value to the third signal count. Finally, the ambient light level is determined from the integral level and the at least one display level.

In at least one embodiment a single display level is determined from a number of first counts and a number of second counts. The display level is indicative of an amount of integrated incident light which is emitted by the display during the total integration time. The ambient light level is determined from the integral level and the display level. A single display level may comprise a sum of individual display levels or a mean or average of display levels.

In at least one embodiment the duration of a period is determined by a picture refresh signal of the display. The picture refresh signal may be determined by a refresh rate of the display which is a number of times in a second that a display hardware updates an image. The refresh rate typically is known from the specifications of the display or can be set by the user.

In at least one embodiment determining the first and second signal counts is synchronized to the picture refresh signal. For example, the first and second signal counts can be determined right before and after a peak in the picture refresh signal, respectively.

In at least one embodiment the duration of an on-state with respect to a duration of an off-state is determined by a duty cycle of the display. A duty cycle is the fraction of one period in which a signal or system is active. Duty cycle is commonly expressed as a percentage or a ratio. The period introduced above corresponds to the time it takes for display, or control signal, to complete an on-and-off cycle. The duty cycle typically is either known or can be set by the user.

In at least one embodiment the duty cycle is constant for the duration of the total integration time.

In at least one embodiment the ambient light level is determined depending on weighted first, second and third signal counts. As the image shown by the display or ambient light may change during the total integration weighting factors allow to account for such changes.

In at least one embodiment the first, second and third signal counts on weighted by weighting factors determined by the duty cycle and/or the picture refresh signal.

In at least one embodiment the first and second signal counts are determined and close temporal succession. In particular, the first and second signal counts are determined within the time period, given by 15%, 10%, 5% or 1% of the duration of a period.

In at least one embodiment the light sensor arrangement comprises a single light sensor. The first, second and third signal counts are determined from the single light sensor.

The proposed concept suggests a method to measure light such as ambient light, using a light sensor located behind a display without the need to control the display itself. For example, by placing an ALS sensor behind a display, the sensor does not only see the ambient light passing through the display, but also the display light itself which is radiated and/or reflected to the display backside as well.

The proposed concept offers means to separate the ambient light from the entire seen sensor light, i.e. display and ambient. Basically, in the proposed concept three different types of light measurements are conducted: a first signal count is measured during a time frame when the display is on, a second signal count is measured during a time frame when the display is off. In addition, the third signal count is measured during the total integration time, e.g. continuously over time. This allows for collecting light at each time both in display ON and Off-state. This approach allows for accurate measurement of the ambient light level at comparably high picture refresh rates. Modulated light, such as 50 Hz to 60 Hz or PWM modulated light, can be used without suffering from under-sampling effects as defined by the Nyquist criterion.

In the following, the concept presented above is described in further detail with respect to drawings, in which exemplary embodiments are presented.

In the exemplary embodiments and Figures below, similar or identical elements may each be provided with the same reference numerals. The elements illustrated in the drawings and their size relationships among one another, however, should not be regarded as true to scale. Rather individual elements, such as layers, components, and regions, may be exaggerated to enable better illustration or improved understanding.

BRIEF DESCRIPTION OF THE DRAWINGS

FIG. 1 shows an exemplary method for sensing light,
FIG. 2 shows another exemplary method for sensing light,
FIG. 3 shows an exemplary embodiment of an electronic device with a display and light sensor arrangement, and
FIG. 4 shows a common method for light sensing from the prior art.

DETAILED DESCRIPTION

FIG. 1 shows an exemplary method for sensing light. The drawing depicts to signals as a function of time t. The top graph shows a light intensity I(t) as a function of time present at the location of a light sensor arrangement 12. The light sensor arrangement is mounted behind a display 11 of an electronic device (see FIG. 3).

The display 11 can be periodically switched on and off depending on a control signal CS, e.g. a PWM signal provided by control electronics of display driver circuitry (not shown). The light intensity graph I(t) shows four periods PD of consecutive on and off-states ON, OFF of the display 11. The period PD is determined by the picture refresh signal PR or by a refresh rate of the display 11 which is a number of times in a second that a display hardware updates an image. The bottom graph shows a picture refresh signal PR as a function of time. The picture refresh signal PR indicates the refresh rate of the display 11. The refresh rate is known from the specifications of the display or can be set by the user. Furthermore, a duration of an off-state OFF and an On-state is determined by a duty cycle DC of the display 11. The duty cycle DC is a fraction of one period PD in which a signal or system is active. The period PD thus corresponds to the time it takes for display 11, or control signal CS, to complete an on-and-off cycle, i.e. a succession of one on- and one off-state ON, OFF. The duty cycle DC typically is either known or can be set by the user.

The light sensor arrangement is set to generate a sensor signal INT. The sensor signal INT is generated by integrating the incident light which reaches the light sensor arrangement through the display. The sensor signal integrates such light for a total integration time T_INT. The total integration time T_INT comprises a number of periods PD. For example, the total integration time is set to 100 ms and a period has a duration of 16.7 ms. Then about six periods of consecutive on- and off-states ON, OFF are included in one total integration time T_INT.

The sensor signal INT is also a function of time t. Signal counts are determined from the sensor signal INT at certain time stamps. In fact, first and second signal counts are determined at time stamps that are synchronized to the picture refresh signal PR. For example, the first and second signal counts can be determined right before and after a peak in the picture refresh signal PR, respectively.

A first signal count Dn+An corresponds to a fraction of the sensor signal INT integrated during an on-state of the display 11. Thus, a first signal count is a measure of light intensity measured by the light sensor arrangement 12 (located behind the display) during the complete on-state ON or during a predetermined time t_Dn+An or time window. For example, the predetermined time t_Dn+An in this exemplary embodiment is set to 1 ms. During an on-state ON the light sensor arrangement collects light Dn which is emitted by the display 11 and ambient light An which originates from light sources outside the display, such as sunlight, room lighting etc.

A second signal count An corresponds to a fraction of the sensor signal INT integrated during an OFF-state of the display 11. Thus, a second signal count An is a measure of light intensity measured by the light sensor arrangement 12 (located behind the display) during the complete off-state OFF or during a predetermined time t_An or time window. For example, the predetermined time t_An in this exemplary embodiment is set to 1 ms. During an off-state OFF the light sensor arrangement collects ambient light An.

Finally, a third signal count Aint+Dint corresponds to a fraction of the sensor signal INT integrated during a number of periods of consecutive on- and off-states ON, OFF of the display 11. As the sensor signal INT is integrated over the total integration time T_INT the third signal count Aint+Dint is a measure of light intensity measured by the light sensor arrangement 12 (located behind the display) during the whole integration, i.e. including a number of periods PD.

In order to derive an ambient light level AL the third signal count Aint+Dint can be corrected using the first and second counts Dn+An, An. Assuming that both display brightness and ambient light have constant intensity during the total integration time T_INT the first signal count measured for 1 ms is denoted (D+A)_1 ms and the second signal count is denoted A_1 ms. Then a display level D_100 ms is given as $$D\_100\text{ ms} = [6 \cdot (D+A)\_1\text{ ms} - 6 \cdot A\_1\text{ ms}] \cdot PD \cdot DC,$$

assuming that six periods PD fit into the total integration time T_INT. DC denotes the duty cycle of the display. The signal counts in this example could be measured just once or six times, for example. The resulting display level (D)_100 ms is weighted by weighting factors such as the refresh rate PD and/or duty cycle DC. The ambient light level A_100 ms can be derived from $$A\_100\text{ ms} = (A+D)\_100\text{ ms} - D\_100\text{ ms},$$

wherein (A+D)_100 ms denotes the third signal count.

FIG. 2 shows an exemplary method for sensing light. This example is similar to the one discussed in FIG. 1. However, both display brightness and ambient light change intensity during the total integration time T_INT. In order to account for these changes, a number of signal counts are recorded. For example, six first signal counts, denoted by (D1+A1)_1 ms, (D2+A2)_1 ms, (D3+A3)_1 ms, (D4+A4)_1 ms, (D5+A5)_1 ms, and (D6+A6)_1 ms and six second signal counts, denoted by A1_1 ms, A2_1 ms, A3_1 ms, A4_1 ms, A5_1 ms, A6_1 ms, are determined from the sensor signal INT. These different 1 ms long integrated signal counts (for about 100 ms total integration time, and about 16.7 ms refresh rate) can be translated into a set of six display levels D1_1 ms, D2_1 ms, D3_1 ms, D4_1 ms, D5_1 ms, and D6_1 ms:

$$(D1+A1)\_1\text{ ms} - A1\_1\text{ ms} = D1\_1\text{ ms}$$

$$(D2+A2)\_1\text{ ms} - A2\_1\text{ ms} = D2\_1\text{ ms}$$

$$(D3+A3)\_1\text{ ms} - A3\_1\text{ ms} = D3\_1\text{ ms}$$

$$(D4+A4)\_1\text{ ms} - A4\_1\text{ ms} = D4\_1\text{ ms}$$

$$(D5+A5)\_1\text{ ms} - A5\_1\text{ ms} = D5\_1\text{ ms}$$

$$(D6+A6)\_1\text{ ms} - A6\_1\text{ ms} = D6\_1\text{ ms}.$$

These display levels can be weighted by the duty cycle DC and the refresh rate. Assuming a duty cycle DC of 65% and refresh rate PD of 16.7 ms, weighted display levels D1, ..., D6 yield $$D1 = 16.7 \cdot 0.65 \cdot D1\_1\text{ ms}$$

$$D2 = 16.7 \cdot 0.65 \cdot D2\_1\text{ ms}$$

$$D3 = 16.7 \cdot 0.65 \cdot D3\_1\text{ ms}$$

$$D4 = 16.7 \cdot 0.65 \cdot D4\_1\text{ ms}$$

$$D5 = 16.7 \cdot 0.65 \cdot D5\_1\text{ ms}$$

$$D6 = 16.7 \cdot 0.65 D6\_1\text{ ms}.$$

An entire 100 ms integrated display level with duty cycle taken into account yields $$\begin{aligned}D\_100\text{ms} &= D1 + D2 + D3 + D4 + D5 + D6 \\ &= 16.7 \cdot 0.65 \cdot D1\_1\text{ ms} + 16.7 \cdot 0.65 \cdot D2\_1\text{ ms} + \\ &\quad 16.7 \cdot 0.65 \cdot D3\_1\text{ ms} + 16.7 \cdot 0.65 \cdot D4\_1\text{ ms} + \\ &\quad 16.7 \cdot 0.65 \cdot D5\_1\text{ ms} + 16.7 \cdot 0.65 \cdot D6\_1\text{ ms} \\ &= (D1\_1\text{ ms} + D2\_1\text{ ms} + D3\_1\text{ ms} + D4\_1\text{ ms} +\end{aligned}$$

-continued
$$\begin{aligned}&D5\_1\text{ ms} + D6\_1\text{ ms}) \cdot 16.7 \cdot 0.65 \\ &= [(D1+A1)\_1\text{ ms} + (D2+A2)\_1\text{ ms} + (D3+A3)\_1\text{ ms} + \\ &\quad (D4+A4)\_1\text{ ms} + (D5+A5)\_1\text{ ms} + (D6+A6)\_1\text{ ms} - \\ &\quad (A1\_1\text{ ms} + A2\_1\text{ ms} + A3\_1\text{ ms} + A4\_1\text{ ms} + \\ &\quad A5\_1\text{ ms} + A6\_1\text{ ms})] \cdot 16.7 \cdot 0.65.\end{aligned}$$

Thus, the different first and second signal counts are summed six times, similar to FIG. 1. Finally, the ambient light level can be determined as $$A\_100\text{ ms} = (A+D)\_100\text{ ms} - D\_100\text{ ms}.$$

In an embodiment (not shown) an integral level A+D can be determined from the third signal count Aint+Dint. The integral level A+D is indicative of a combined amount of integrated incident light emitted by the display 11 during the total integration time T_INT and of incident ambient light received during the total integration time T_INT. Typically, the integral level is same as the third signal count Aint+Dint. However, as the total integration time T_INT generally can be shorter or longer than an integer number of periods PD, the resulting time difference may be accounted for by multiplying the third signal count Aint+Dint with a multiplication factor to yield the integral level A+D.

FIG. 3 shows an exemplary embodiment of an electronic device with a display and light sensor arrangement. The electronic device has a surface 13 and the display 11 is arranged on the surface. The display 11 comprises a panel of pixels 14, a backlight panel 15 and a reflector 16. The light sensor arrangement 12 is arranged behind the display 11 (with respect to the main direction of emission).

During operation of the display several light sources may contribute to the sensor signal generated by the light sensor arrangement. A fraction of the emitted light EL emitted by the display may be reflected back towards the light sensor arrangement as indicated by arrows in the drawing. The emitted light may partly stem from the pixels arranged in panel 14 and/or from LEDs used for backlighting the display. Furthermore, ambient light from different sources may strike the display and traverse towards the light sensor arrangement with gives rise to a contribution to the sensor signal. The electronic device depicted in FIG. 3 illustrates one possible embodiment. Other types of displays and arrangements are possible without restricting the scope of the proposed concept.

The invention claimed is:

1. A method for sensing light being incident on an electronic device, the electronic device comprising a display and a light sensor arrangement mounted behind the display such as to receive incident light through the display, the method comprising the steps of:
periodically switching the display on and off depending on a control signal, wherein a period of said periodical switching is defined by the time of a succession of an on-state and an off-state of the display,
generating a sensor signal by integrating the incident light by means of the light sensor arrangement for a total integration time comprising a plurality of said periods of periodical switching,
for at least some on-states included in the total integration time, determining a respective first signal count from the sensor signal being indicative of an amount of integrated incident light during the corresponding on-state, for at least some off-states included in the total integration time, determining a respective second signal count from the sensor signal being indicative of an amount of integrated incident light during the corresponding off-state, determining a display light level comprising subtracting the sum of all determined second signal counts from the sum of all determined first signal counts, determining a third signal count from the sensor signal being indicative of an amount of integrated incident light during the total integration time, and determining an ambient light level depending on the first, second and third signal counts by subtracting the display light level from the third signal count.

2. The method according to claim 1, wherein the sensor signal is generated by continuously integrating the incident light for the duration of the total integration time.

3. The method according claim 1, wherein the first and second signal counts are determined by tapping the sensor signal for a predetermined time during integrating the incident light.

4. The method according to claim 1, wherein the first and second signal counts are determined from the sensor signal integrated during at least one period.

5. The method according to claim 1, wherein for each period of successive on- and off-states set of first signal count and second signal count are determined, respectively.

6. The method according to claim 1, wherein
at least one display level is determined from at least one first count and at least one second count, wherein the display level is indicative of an amount of integrated incident light emitted by the display during at least one period,
an integral level is determined from the third signal count, wherein the integral level is indicative of a combined amount of integrated incident light emitted by the display during the total integration time and of incident ambient light received during the total integration time, and
the ambient light level is determined from the integral level and the at least one display level.

7. The method according to claim 1, wherein
a single display level is determined from a number of first counts and a number of second counts, wherein the display level is indicative of an amount of integrated incident light emitted by the display during the total integration time, and
the ambient light level is determined from the integral level and the display level.

8. The method according to claim 1, wherein the duration of a period is determined by a picture refresh signal of the display.

9. The method according to claim 8, wherein determining the first and second signal counts is synchronized to the picture refresh signal.

10. The method according to claim 1, wherein a duration of an on-state with respect to a duration of an off-state is determined by a duty cycle of the display.

11. The method according to claim 10, wherein the duty cycle is constant for the duration of the total integration time.

12. The method according to claim 1, wherein ambient light level is determined depending on weighted first, second and third signal counts.

13. The method according to claim 12, wherein the first, second and third signal counts are weighted by weighting factors determined by the duty cycle and/or the picture refresh signal.

14. The method according to claim 1, wherein the first and second signal counts are determined in close temporal succession, or the first and second signal counts are determined within a time period given by 15%, 10%, 5%, or 1% of the duration of a period.

15. The method according to claim 1, wherein
the light sensor arrangement comprises a single light sensor and the first, second and third signal counts are determined from the single light sensor.

16. A method for sensing light being incident on an electronic device, the electronic device comprising a display and a light sensor arrangement mounted behind the display such as to receive incident light through the display, the method comprising the steps of:
periodically switching the display on and off depending on a control signal, wherein a period is defined by a succession of an on-state and an off-state of the display,
generating a sensor signal by integrating the incident light by means of the light sensor arrangement for a total integration time comprising a number of periods,
determining a first signal count from the sensor signal being indicative of an amount of integrated incident light during an on-state,
determining a second signal count from the sensor signal being indicative of an amount of integrated incident light during an off-state,
determining a third signal count from the sensor signal being indicative of an amount of integrated incident light during the total integration time, and
determining an ambient light level depending on the first, second and third signal counts; and
wherein the first and second signal counts are determined in close temporal succession, or the first and second signal counts are determined within a time period given by 15%, 10%, 5%, or 1% of the duration of a period.

17. A method for sensing light being incident on an electronic device, the electronic device comprising a display and a light sensor arrangement mounted behind the display such as to receive incident light through the display, the method comprising the steps of:
periodically switching the display on and off depending on a control signal, wherein a period is defined by a succession of an on-state and an off-state of the display,
generating a sensor signal by integrating the incident light by means of the light sensor arrangement for a total integration time comprising a number of periods,
determining a first signal count from the sensor signal being indicative of an amount of integrated incident light during an on-state,
determining a second signal count from the sensor signal being indicative of an amount of integrated incident light during an off-state,
determining a third signal count from the sensor signal being indicative of an amount of integrated incident light during the total integration time, and
determining an ambient light level depending on the first, second and third signal counts; and
wherein ambient light level is determined depending on weighted first, second and third signal counts; and
wherein the first, second and third signal counts are weighted by weighting factors determined by the duty cycle and/or the picture refresh signal.

* * * * *